(12) United States Patent
Chen

(10) Patent No.: US 6,239,488 B1
(45) Date of Patent: May 29, 2001

(54) METHOD FOR MOUNTING A SEMICONDUCTOR CHIP ON A SUBSTRATE, AND SEMICONDUCTOR DEVICE ADAPTED FOR MOUNTING ON A SUBSTRATE

(75) Inventor: I-Ming Chen, No. 60, Lane 328, Li-ShanSt., Nei-Hu Dist., Taipei City (TW)

(73) Assignee: I-Ming Chen, Taipei (TW)

( * ) Notice: Subject to any disclaimer, the term of this patent is extended or adjusted under 35 U.S.C. 154(b) by 0 days.

(21) Appl. No.: 09/520,719

(22) Filed: Mar. 8, 2000

(30) Foreign Application Priority Data

Jan. 14, 2000 (TW) ................................................ 89100578

(51) Int. Cl.[7] .................................................... H01L 23/48
(52) U.S. Cl. .......................... 257/737; 257/738; 257/773; 257/779
(58) Field of Search .................................... 257/737, 738, 257/773, 779, 780, 786, 778; 438/108, 612–615

(56) References Cited

U.S. PATENT DOCUMENTS

| | | | |
|---|---|---|---|
| 5,990,546 | * 11/1999 | Igarashi | 257/700 |
| 6,075,712 | * 6/2000 | McMahon | 257/690 |
| 6,114,754 | * 9/2000 | Kata | 257/668 |
| 6,143,991 | * 11/2000 | Moriyama | 257/781 |

* cited by examiner

Primary Examiner—Olik Chaudhuri
Assistant Examiner—Nathan W. Ha
(74) Attorney, Agent, or Firm—Foley & Lardner

(57) ABSTRACT

A semiconductor device is adapted for mounting on a substrate that has a chip-mounting region provided with a plurality of solder points. The semiconductor device includes a semiconductor chip having a pad-mounting surface provided with a plurality of bonding pads which are disposed on the pad-mounting surface at locations that are offset from locations of corresponding ones of the solder points on the chip-mounting region. Conductive bodies are formed on the pad-mounting surface to establish the required electrical connection among the bonding pads and the corresponding ones of the solder points.

10 Claims, 9 Drawing Sheets

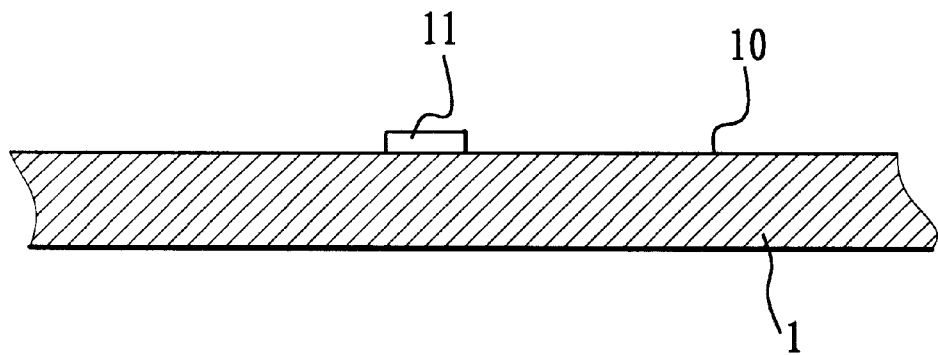
F I G. 1
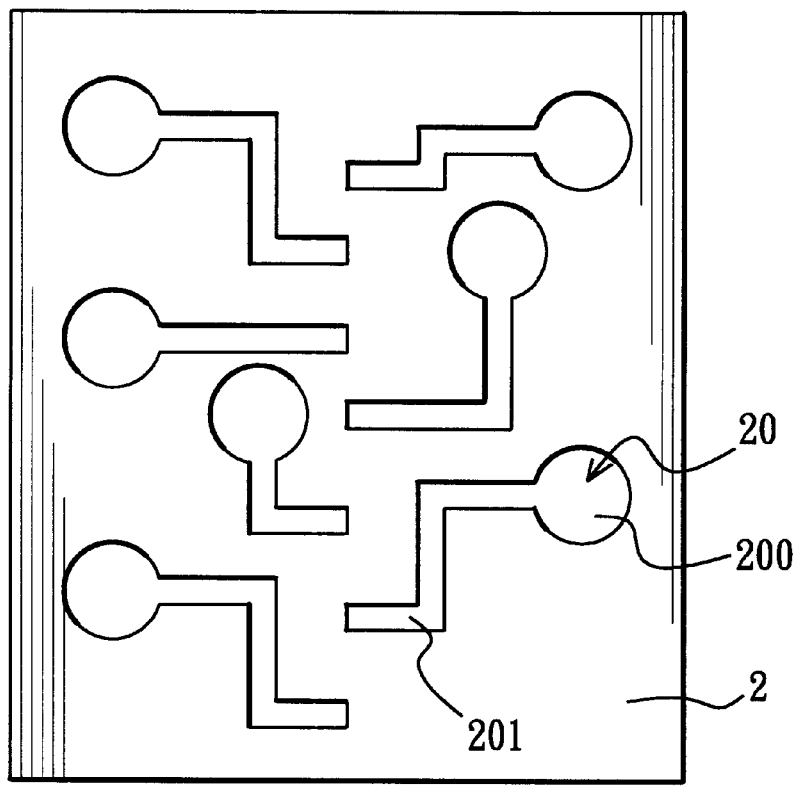
F I G. 2

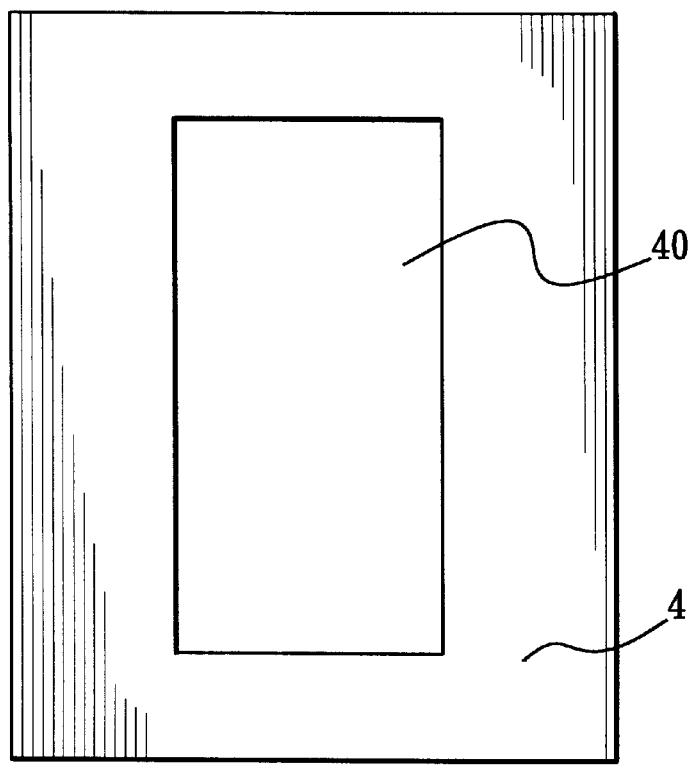
F I G. 7
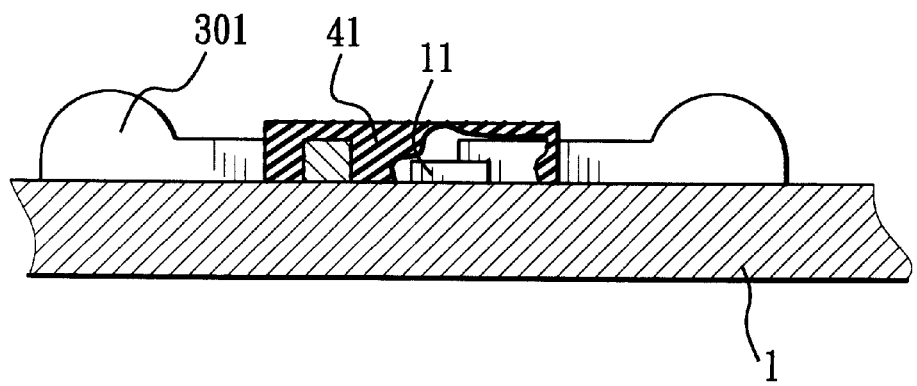
F I G. 8

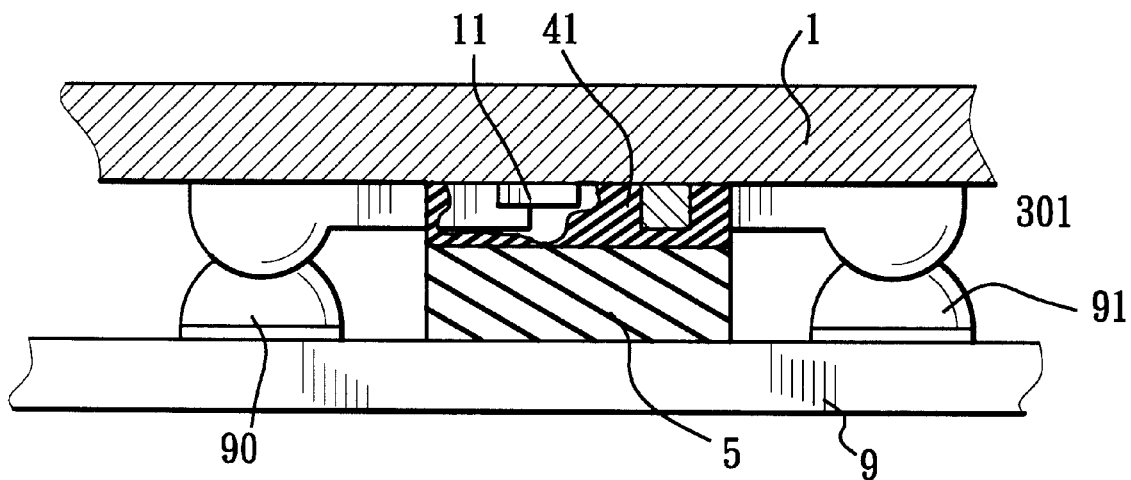
F I G. 9
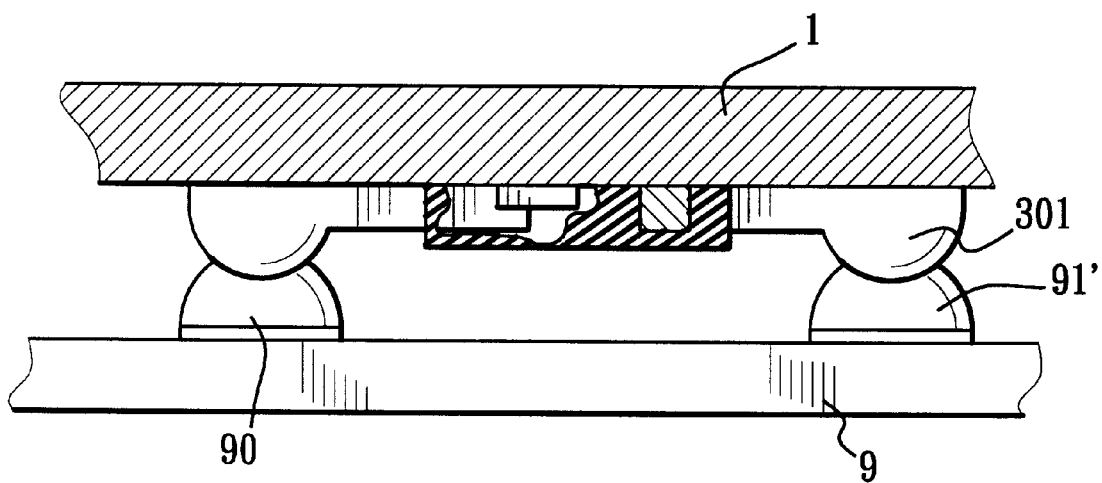
F I G. 10

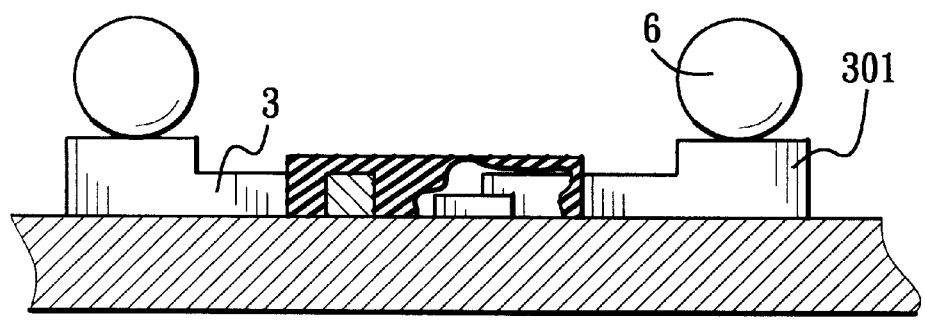
F I G. 11
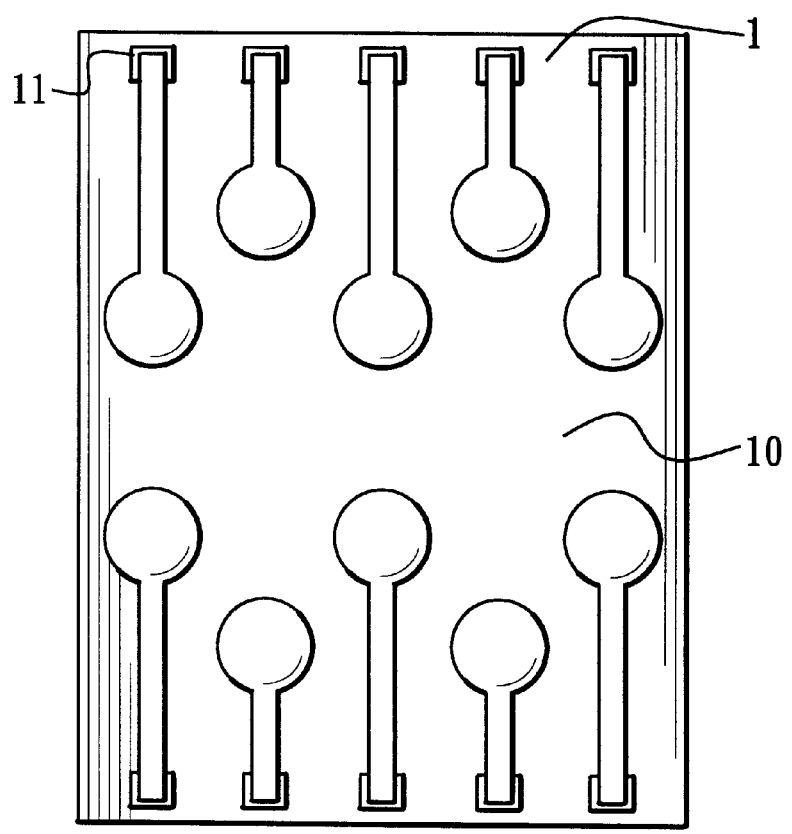
F I G. 12

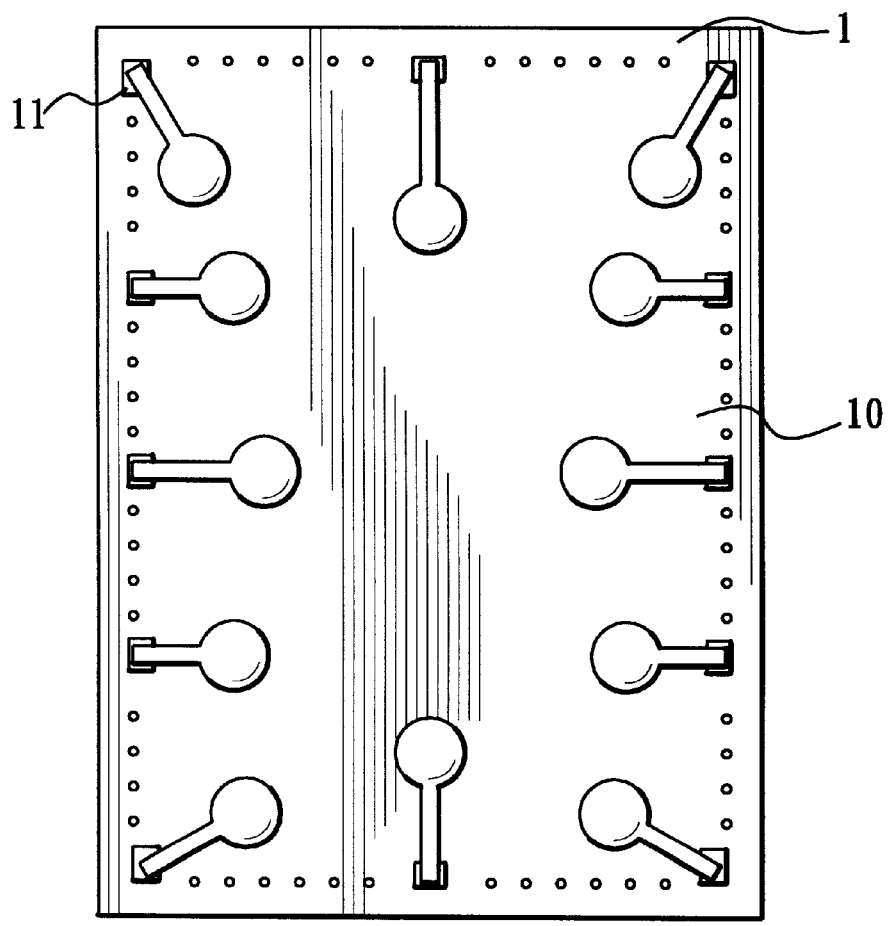
F I G. 13
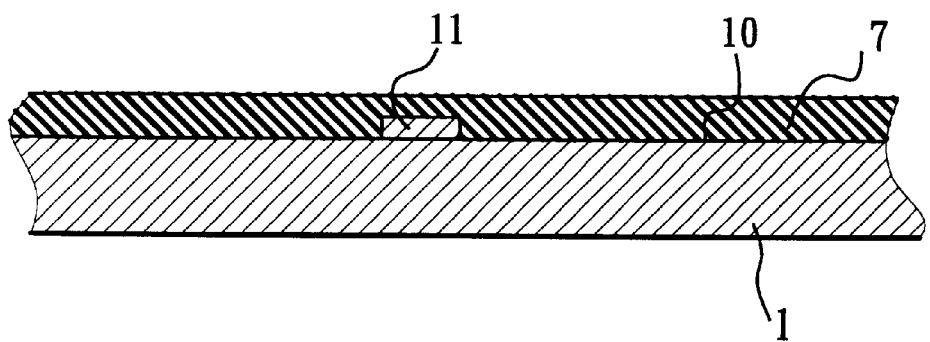
F I G. 14

US 6,239,488 B1

METHOD FOR MOUNTING A SEMICONDUCTOR CHIP ON A SUBSTRATE, AND SEMICONDUCTOR DEVICE ADAPTED FOR MOUNTING ON A SUBSTRATE

BACKGROUND OF THE INVENTION

1. Field of the Invention

The invention relates to a method for mounting a semiconductor chip on a substrate and to a semiconductor device that is adapted for mounting on a substrate.

2. Description of the Related Art

With the rapid advancement in semiconductor fabrication technology, the bonding pads on the surface of a semiconductor chip are getting smaller in size, and the distances between adjacent bonding pads are getting shorter. These can create difficulty when connecting the semiconductor chip to an external circuit, and can affect adversely the production yield.

SUMMARY OF THE INVENTION

Therefore, the main object of the present invention is to provide a method for mounting a semiconductor chip on a substrate so as to overcome the aforesaid drawback.

Another object of the present invention is to provide a semiconductor device adapted for mounting on a substrate and capable of overcoming the aforesaid drawback.

According to one aspect of the invention, there is provided a method for mounting a semiconductor chip on a substrate having a chip-mounting region provided with a plurality of solder points. The semiconductor chip has a pad-mounting surface provided with a plurality of bonding pads, which are to be connected to corresponding ones of the solder points and which are disposed on the pad-mounting surface at locations that are offset from locations of the corresponding ones of the solder points on the chip-mounting region. The method comprises the steps of:

superimposing a steel plate on the pad-mounting surface of the semiconductor chip, the steel plate being formed with a plurality of holes at positions registered with the bonding pads on the pad-mounting surface, each of the holes including a first hole part that exposes at least a part of the registered one of the bonding pads on the pad-mounting surface, and a second hole part that exposes a respective portion of the pad-mounting surface and that extends from the first hole part to a location corresponding to that of a respective one of the solder points on the chip-mounting region of the substrate, the holes being confined by walls that cooperate with the pad-mounting surface to form contact receiving spaces; and using a conductive metal paste as printing material, printing on the steel plate to form conductive bodies in the contact receiving spaces, each of the conductive bodies having an extension portion that is disposed in the first hole part so as to connect electrically with the registered one of the bonding pads and that serves as a circuit trace, and an electrical connection portion that is formed in the second hole part on one end of the extension portion and that extends to the location corresponding to that of the respective one of the solder points on the chip-mounting region of the substrate.

According to another aspect of the present invention, there is provided a method for mounting a semiconductor chip on a substrate having a chip-mounting region provided with a plurality of solder points. The semiconductor chip has a pad-mounting surface provided with a plurality of bonding pads, which are to be connected to corresponding ones of the solder points and which are disposed on the pad-mounting surface at locations that are offset from locations of the corresponding ones of the solder points on the chip-mounting region. The method comprises the steps of:

forming a photoresist layer on the pad-mounting surface of the semiconductor chip;

forming a plurality of contact receiving cavities in the photoresist layer at positions registered with the bonding pads on the pad-mounting surface, each of the contact receiving cavities including a first cavity part that exposes at least a part of the registered one of the bonding pads on the pad-mounting surface, and a second cavity part that exposes a respective portion of the pad-mounting surface and that extends from the first cavity part to a location corresponding to that of a respective one of the solder points on the chip-mounting region of the substrate; and forming conductive bodies in the contact receiving cavities, each of the conductive bodies having an extension portion that is disposed in the first cavity part so as to connect electrically with the registered one of the bonding pads and that serves as a circuit trace, and an electrical connection portion that is formed in the second cavity part on one end of the extension portion and that extends to the location corresponding to that of the respective one of the solder points on the chip-mounting region of the substrate.

According to still another aspect of the present invention, a semiconductor device is adapted for mounting on a substrate having a chip-mounting region provided with a plurality of solder points. The semiconductor device comprises:

a semiconductor chip having a pad-mounting surface provided with a plurality of bonding pads which are disposed on the pad-mounting surface at locations that are offset from locations of corresponding ones of the solder points on the chip-mounting region; and a plurality of conductive bodies, each of which has an extension portion that is connected electrically to a registered one of the bonding pads and that serves as a circuit trace, and an electrical connection portion that is formed on one end of the extension portion and that extends to a location corresponding to that of a respective one of the solder points on the chip-mounting region of the substrate. The conductive bodies are formed by:

superimposing a steel plate on the pad-mounting surface of the semiconductor chip, the steel plate being formed with a plurality of holes at positions registered with the bonding pads on the pad-mounting surface, each of the holes including a first hole part that exposes at least a part of the registered one of the bonding pads on the pad-mounting surface, and a second hole part that exposes a respective portion of the pad-mounting surface and that extends from the first hole part to a location corresponding to that of the respective one of the solder points on the chip-mounting region of the substrate, the holes being confined by walls that cooperate with the pad-mounting surface to form contact receiving spaces; and using a conductive metal paste as printing material, printing on the steel plate to form the conductive bodies in the contact receiving spaces, the extension portions of the conductive bodies being disposed in the first hole parts of the holes, the electrical connection portions of the conductive bodies being disposed in the second hole parts of the holes.

According to a further aspect of the present invention, a semiconductor device is adapted for mounting on a substrate having a chip-mounting region provided with a plurality of solder points. The semiconductor device comprises:

a semiconductor chip having a pad-mounting surface provided with a plurality of bonding pads which are disposed on the pad-mounting surface at locations that are offset from locations of corresponding ones of the solder points on the chip-mounting region;

a photoresist layer formed on the pad-mounting surface of the semiconductor chip, the photoresist layer being formed with a plurality of contact receiving cavities at positions registered with the bonding pads on the pad-mounting surface, each of the contact receiving cavities including a first cavity part that exposes at least a part of the registered one of the bonding pads on the pad-mounting surface, and a second cavity part that exposes a respective portion of the pad-mounting surface and that extends from the first cavity part to a location corresponding to that of a respective one of the solder points on the chip-mounting region of the substrate; and a plurality of conductive bodies formed respectively in the contact receiving cavities, each of the conductive bodies having an extension portion that is disposed in the first cavity part so as to connect electrically with the registered one of the bonding pads and that serves as a circuit trace, and an electrical connection portion that is formed in the second cavity part on one end of the extension portion and that extends to the location corresponding to that of the respective one of the solder points on the chip-mounting region of the substrate.

BRIEF DESCRIPTION OF THE DRAWINGS

Other features and advantages of the present invention will become apparent in the following detailed description of the preferred embodiments with reference to the accompanying drawings, of which:

FIG. 1 is a sectional view illustrating a semiconductor chip to be mounted on a substrate according to the first preferred embodiment of a mounting method of the present invention;

FIG. 2 is a schematic view illustrating a steel plate used in the mounting method of the first preferred embodiment;

FIG. 7 is a schematic view illustrating a mask for the semiconductor chip of FIG. 5;

FIG. 8 is a sectional view illustrating a semiconductor device prepared according to the mounting method of the first preferred embodiment;

FIG. 9 is a sectional view illustrating the semiconductor device of FIG. 8 when mounted on a substrate in accordance with the mounting method of the first preferred embodiment;

FIG. 10 is a sectional view illustrating how a semiconductor device is mounted on a substrate in accordance with the second preferred embodiment of a mounting method according to the present invention;

FIG. 11 is a sectional view illustrating a semiconductor device prepared according to the third preferred embodiment of a mounting method of this invention;

FIG. 12 is a schematic view illustrating a semiconductor chip after undergoing a printing step according to the fourth preferred embodiment of a mounting method of this invention;

FIG. 13 is a schematic view illustrating a semiconductor chip after undergoing a printing step according to the fifth preferred embodiment of a mounting method of this invention;

FIG. 14 is a sectional view illustrating a semiconductor chip to be mounted on a substrate according to the sixth preferred embodiment of a mounting method according to the present invention;

DETAILED DESCRIPTION OF THE PREFERRED EMBODIMENTS

Figure 3:
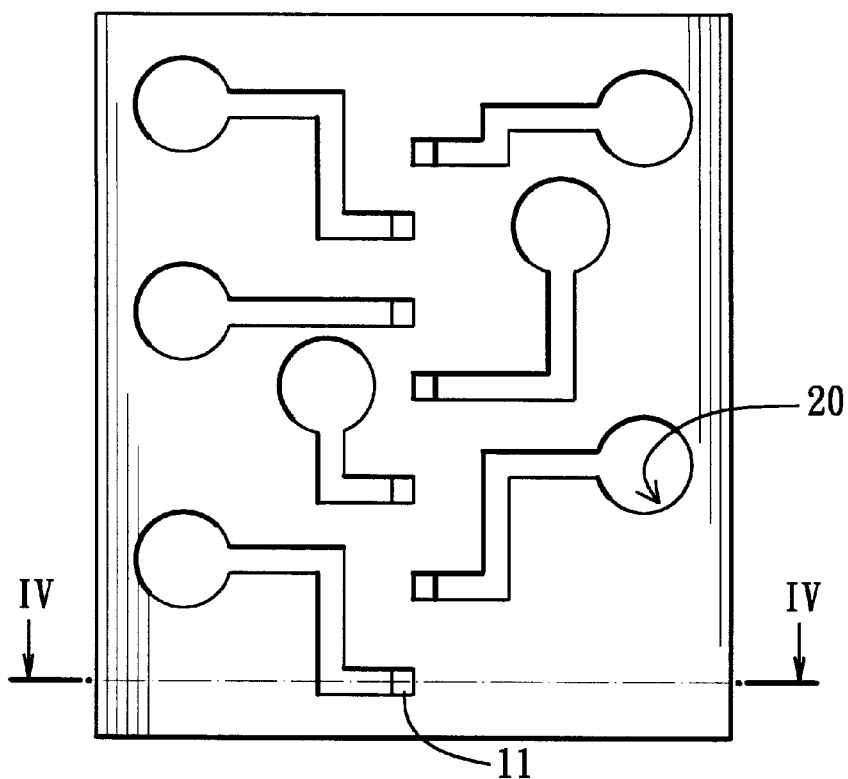
FIG. 3 is a schematic view illustrating the steel plate of FIG. 2 when superimposed upon the semiconductor chip of FIG. 1 in accordance with the mounting method of the first preferred embodiment.

Before the present invention is described in greater detail, it should be noted that like elements are denoted by the same reference numerals throughout the disclosure.

Referring to FIG. 1, in the first preferred embodiment of a mounting method according to the present invention, there is provided a semiconductor chip 1 having a pad-mounting surface 10 with a plurality of bonding pads 11 (only one is shown in this Figure) provided thereon. The semiconductor chip 1 is to be mounted on a substrate 9 (see FIG. 9). The substrate 9, such as a system board, has a chip-mounting region provided with a plurality of solder points 90. The bonding pads 11 are to be connected to corresponding ones of the solder points 90, but are disposed on the pad-mounting surface 10 at locations that are offset from locations of the corresponding ones of the solder points 90 on the chip-mounting region.

Figure 4:
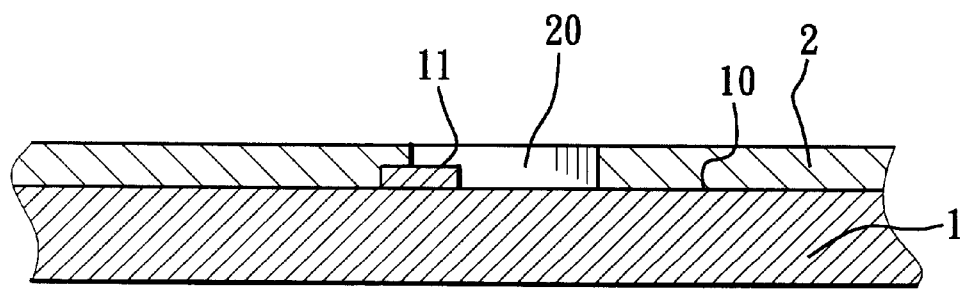
FIG. 4 is a sectional view taken along lines IV—IV in FIG. 3.

Referring to FIGS. 2 to 4, there is provided a steel plate 2 that is superimposed on the pad-mounting surface 10 of the semiconductor chip 1. In this embodiment, the steel plate 2 is a printing screen plate, and is formed with a plurality of non-intersecting holes 20 at positions registered with the bonding pads 11 on the pad-mounting surface 10. Each of the holes 20 includes a first hole part 200 that exposes at least a part of the registered one of the bonding pads 11 on the pad-mounting surface 10, and a second hole part 200 that exposes a respective portion of the pad-mounting surface 10 and that extends from the first hole part 200 to a location corresponding to that of a respective one of the solder points 90 on the chip-mounting region of the substrate 9 (see FIG. 9). Each of the holes 20 is confined by a wall that cooperates with the pad-mounting surface 10 to form a contact receiving space.

Figure 5:
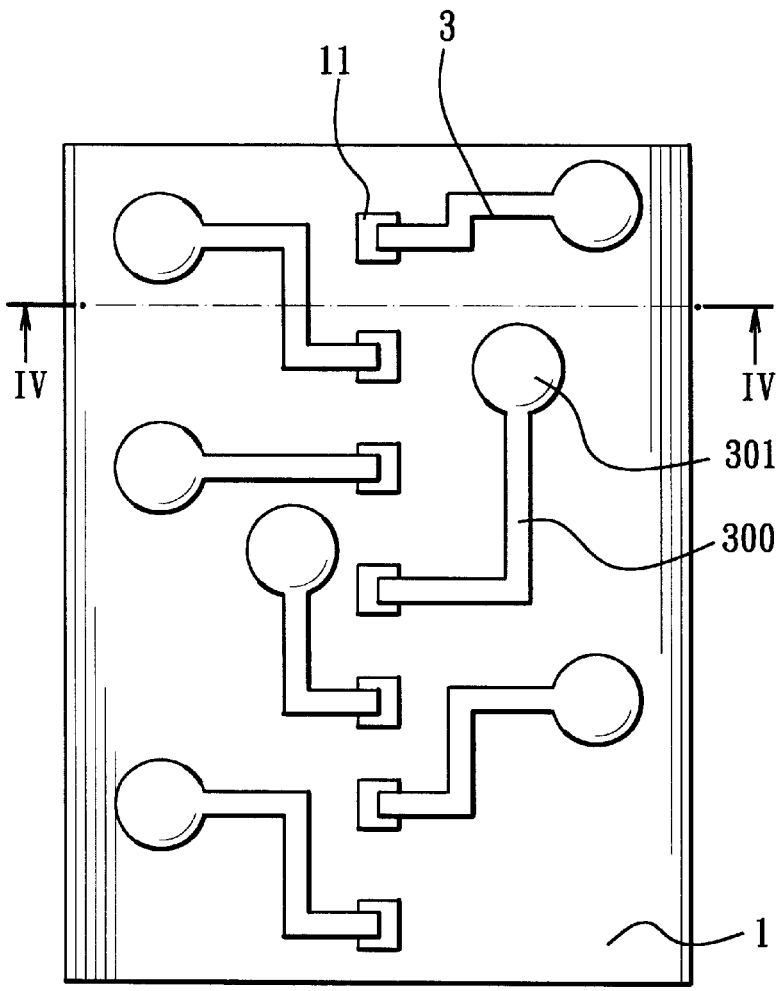
FIG. 5 is a schematic view illustrating the semiconductor chip of FIG. 3 after undergoing a printing step according to the mounting method of the first preferred embodiment.
Figure 6:
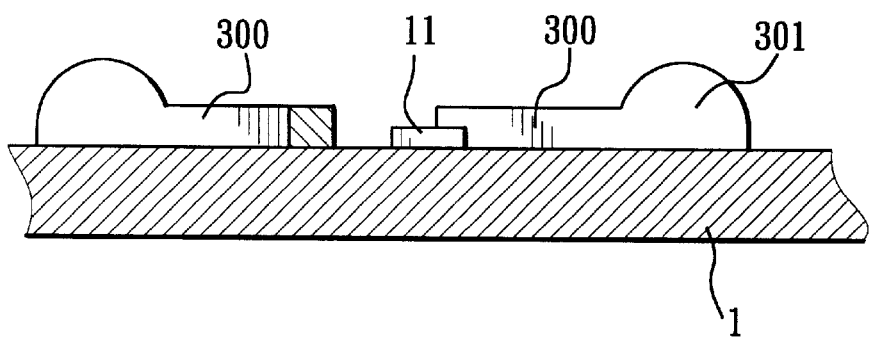
FIG. 6 is a sectional view taken along lines VI—VI in FIG. 5.

Thereafter, as shown in FIGS. 5 and 6, non-intersecting conductive bodies 3 are formed respectively in the contact receiving spaces via a printing technique that uses a conductive metal paste as printing material. Upon removal of the steel plate 2 from the pad-mounting surface 10, the conductive bodies 3 are processed by heating and drying to harden the same. Preferably, the conductive metal paste is one that contains silver, gold, copper, iron, aluminum, tin or other conductive metal materials. Each of the conductive bodies 3 has an elongate extension portion 300 that is disposed in the first hole part 200 so as to connect electrically with the registered one of the bonding pads 11 and that serves as a circuit trace, and an electrical connection portion 301 that is formed in the second hole part 201 on one end of the extension portion 300 and that extends to the location corresponding to that of the respective one of the solder points 90 on the chip-mounting region of the substrate 9 (see FIG. 9) for electrical connection therewith.

Referring to FIGS. 7 and 8, after hardening the conductive bodies 3, a mask 4 is superimposed subsequently on the pad-mounting surface 10 of the semiconductor chip 1. The mask 4 is formed with an opening 40 to expose connections formed among the extension portions 300 of the conductive bodies 3 and the bonding pads 11 on the pad-mounting surface 10. The opening 40 is confined by a wall that cooperates with the pad-mounting surface 10 to form a protective-layer forming space. An insulator material, such as epoxy resin, fills the protective-layer forming space to form a protective layer 41 that encloses the connections formed among the extension portions 300 of the conductive bodies 3 and the bonding pads 11 on the pad-mounting surface 10. The mask 4 is removed from the semiconductor chip 1 thereafter. A semiconductor device is thus obtained, as shown in FIG. 8.

As shown in FIG. 9, the semiconductor device of FIG. 8 is mounted on the chip-mounting region of the substrate 9. The electrical connection portions 301 of the conductive bodies 3 are connected to the corresponding ones of the solder points 90 via conductive paste 91 on the latter, thereby establishing electrical connection between the semiconductor chip 1 and the substrate 9. Preferably, an adhesive layer 5 adheres the semiconductor device of FIG. 8 to the chip-mounting region of the substrate 9 to prevent relative movement therebetween prior to heating of the assembly of the semiconductor device and the substrate 9 so as to harden the conductive paste 91.

Referring to FIG. 10, in the second preferred embodiment of a mounting method according to the present invention, the electrical connection portions 301 of the conductive bodies 3 on the semiconductor device of FIG. 8 are connected to the corresponding ones of the solder points 90 on the chip-mounting region of the substrate 9 via solder paste 91' on the latter, thereby establishing electrical connection between the semiconductor chip 1 and the substrate 9. The adhesive layer used in the first preferred embodiment can be eliminated due to the use of the solder paste 91'.

It should be understood that, by controlling the sizes of the holes 20 in the steel plate 2 (see FIGS. 2 to 4), the thickness of the electrical connection portions 301 of the conductive bodies 3 can be controlled accordingly. Referring to FIG. 11, in the third preferred embodiment of a mounting method according to the present invention, the electrical connection portions 301 of the conductive bodies 3 of this embodiment are thinner than the electrical connection portions 301 of the conductive bodies 3 of the embodiment shown in FIG. 8. Thus, after forming the conductive bodies 3 in the mounting method of the third preferred embodiment, a conductive ball 6, such as a solder ball, is provided on the electrical connection portion 301 of each of the conductive bodies 3. The conductive balls 6 are used to establish both mechanical and electrical connection between the semiconductor device of FIG. 11 and a substrate (not shown). When it is desired to replace the semiconductor device of FIG. 11 on the substrate, such as when replacing a defective semiconductor device or during upgrading, the assembly of the semiconductor device and the substrate is heated to melt the conductive balls 6, thereby permitting removal of the semiconductor device from the substrate.

Referring to FIG. 12, in the fourth preferred embodiment of a mounting method according to the present invention, the bonding pads 11 of the semiconductor chip 1 are disposed on opposite side portions of the pad-mounting surface 10.

Referring to FIG. 13, in the fifth preferred embodiment of a mounting method according to the present invention, the bonding pads 11 of the semiconductor chip 1 are disposed on four side portions of the pad-mounting surface 10.

Referring to FIG. 14, in the sixth preferred embodiment of a mounting method according to the present invention, there is provided a semiconductor chip 1 having a pad-mounting surface 10 with a plurality of bonding pads 11 (only one is shown in this Figure) provided thereon. Like the previous embodiments, the semiconductor chip 1 is to be mounted on a substrate 9, such as the system board of FIG. 9. As mentioned hereinbefore, the substrate 9 has a chip-mounting region provided with a plurality of solder points 90, and the bonding pads 11 are to be connected to corresponding ones of the solder points 90, but are disposed on the pad-mounting surface 10 at locations that are offset from locations of the corresponding ones of the solder points 90 on the chip-mounting region of the substrate 9. In this embodiment, a positive photoresist film layer 7 is formed on the pad-mounting surface 10 of the semiconductor chip 1.

Figure 15:
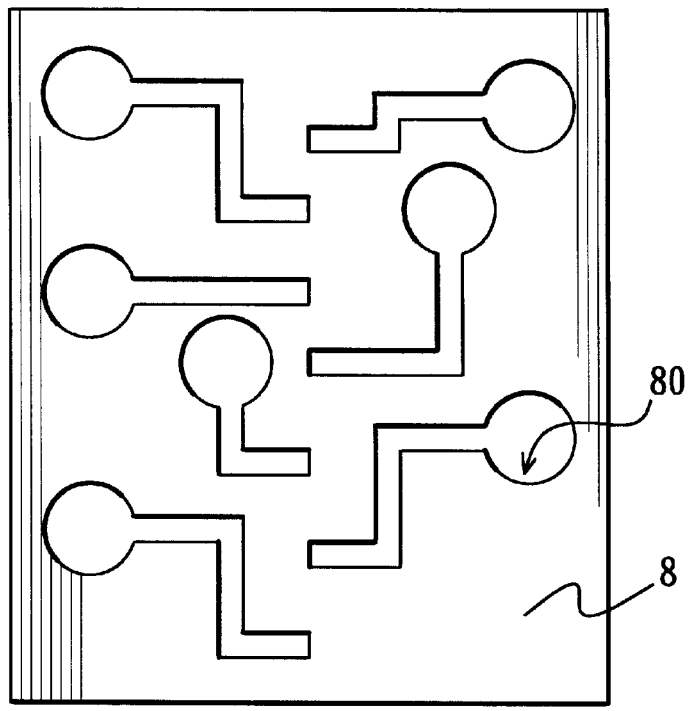
FIG. 15 is a schematic view illustrating a steel plate used in the mounting method of the sixth preferred embodiment.
Figure 16:
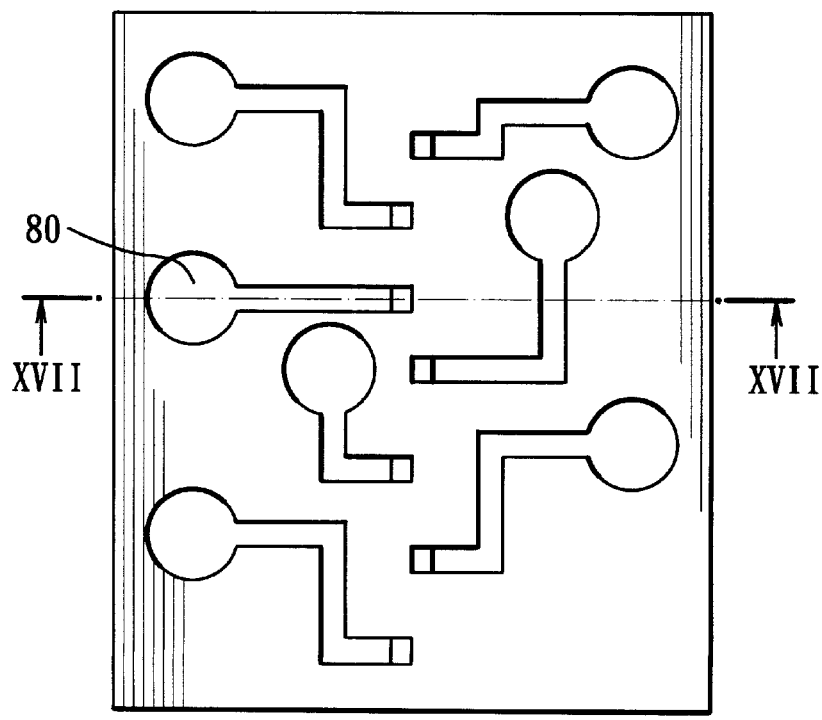
FIG. 16 is a schematic view illustrating the steel plate of FIG. 15 when superimposed upon the semiconductor chip of FIG. 14 in accordance with the mounting method of the sixth preferred embodiment.
Figure 17:
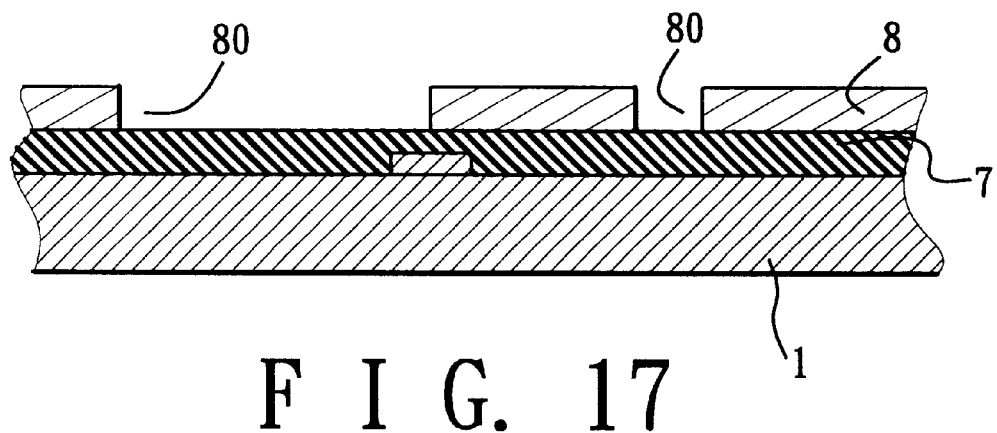
FIG. 17 is a sectional view taken along lines XVII—XVII in FIG. 16.
Figure 18:
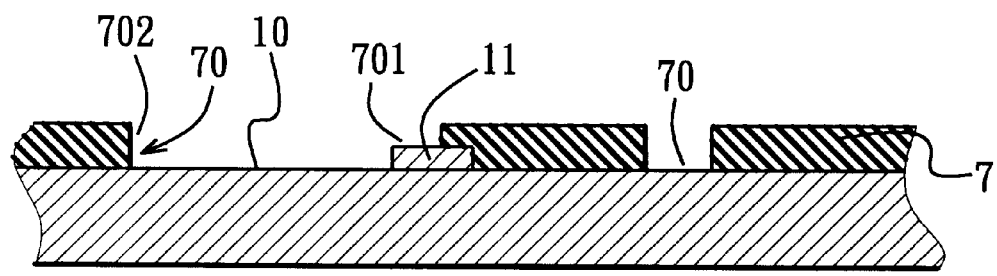
FIG. 18 is a schematic view illustrating the semiconductor chip of FIG. 17 after undergoing an etching step according to the mounting method of the sixth preferred embodiment.

Referring to FIGS. 15 to 17, there is provided a patterned mask 8 that is superimposed on the photoresist film layer 7. The patterned mask 8 is formed with a plurality of light transmissive portions 80 at positions registered with the bonding pads 11 on the pad-mounting surface 10. Using known lithography techniques, including exposure to ultraviolet light and chemical developing, the exposed portions of the photoresist film layer 7 are removed to form non-intersecting contact receiving cavities 70 therein, as shown in FIG. 18. The contact receiving cavities 70 are disposed at positions registered with the bonding pads 11 on the pad-mounting surface 10. Each of the contact receiving cavities 70 includes a first cavity part 701 that exposes at least a part of the registered one of the bonding pads 11 on the pad-mounting surface 10, and a second cavity part 702 that exposes a respective portion of the pad-mounting surface 10 and that extends from the first cavity part 701 to a location corresponding to that of a respective one of the solder points 90 on the chip-mounting region of the substrate 9 (see FIG. 9).

Figure 19:
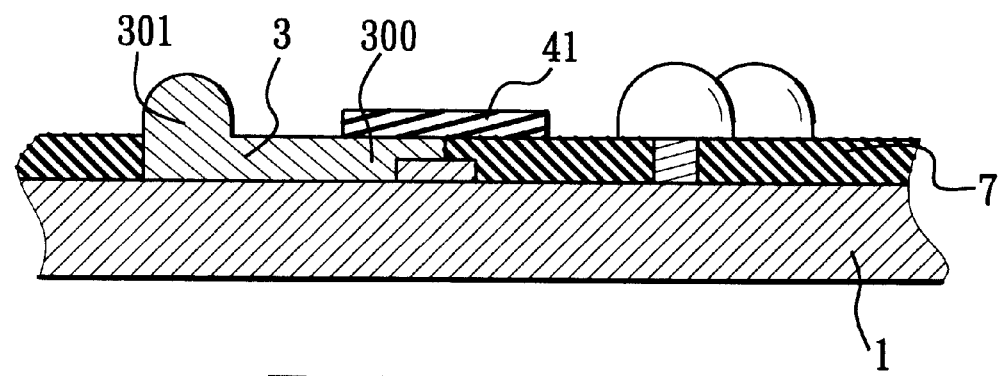
FIG. 19 is a sectional view illustrating a semiconductor device prepared according to the mounting method of the sixth preferred embodiment.

Thereafter, as shown in FIG. 19, non-intersecting conductive bodies 3 are formed respectively in the contact receiving cavities 70, such as by printing with the use of a conductive metal paste as printing material. Like the previous embodiments, each of the conductive bodies 3 has an extension portion 300 that is disposed in the first cavity part 701 so as to connect electrically with the registered one of the bonding pads 11 and that serves as a circuit trace, and an electrical connection portion 301 that is formed in the second cavity part 702 on one end of the extension portion 300 and that extends to the location corresponding to that of the respective one of the solder points 90 on the chip-mounting region of the substrate 9 (see FIG. 9). A protective layer 41, which is made from an insulator material, such epoxy resin, is formed on the photoresist film layer 7 to cover the connections formed among the extension portions 300 of the conductive bodies 3 and the bonding pads 11 on the pad-mounting surface 10. A semiconductor device is thus obtained.

As to how the semiconductor device of FIG. 19 is mounted on the chip-mounting region of the substrate 9, this can be accomplished in a manner similar to that taught in the embodiments of FIGS. 9 and 10 and will not be detailed further for the sake of brevity.

Like the embodiment of FIG. 11, the electrical connection portions 301 of the conductive bodies 3 of this embodiment can be made thinner. Thus, after forming the conductive bodies 3 in the mounting method of this embodiment, a conductive ball, similar to the conductive ball 6 of FIG. 11, can be provided on the electrical connection portion 301 of each of the conductive bodies 3.

While the present invention has been described in connection with what is considered the most practical and preferred embodiments, it is understood that this invention is not limited to the disclosed embodiments but is intended to cover various arrangements included within the spirit and scope of the broadest interpretation so as to encompass all such modifications and equivalent arrangements.

I claim:

1. A semiconductor device adapted for mounting on a substrate, the substrate having a chip-mounting region provided with a plurality of solder points, said semiconductor device comprising:

a semiconductor chip having a pad-mounting surface provided with a plurality of bonding pads which are disposed on said pad-mounting surface at locations that are offset from locations of corresponding ones of the solder points on the chip-mounting region; and a plurality of conductive bodies, each of which has an extension portion that is connected electrically to a registered one of said bonding pads and that serves as a circuit trace, and an electrical connection portion that is formed on one end of said extension portion and that extends to a location corresponding to that of a respective one of the solder points on the chip-mounting region of the substrate, said conductive bodies being formed by:

superimposing a steel plate on said pad-mounting surface of said semiconductor chip, said steel plate being formed with a plurality of holes at positions registered with said bonding pads on said pad-mounting surface, each of said holes including a first hole part that exposes at least a part of the registered one of said bonding pads on said pad-mounting surface, and a second hole part that exposes a respective portion of said pad-mounting surface and that extends from said first hole part to a location corresponding to that of the respective one of the solder points on the chip-mounting region of the substrate, said holes being confined by walls that cooperate with said pad-mounting surface to form contact receiving spaces; and using a conductive metal paste as printing material, printing on said steel plate to form said conductive bodies in said contact receiving spaces, said extension portions of said conductive bodies being disposed in said first hole parts of said holes, said electrical connection portions of said conductive bodies being disposed in said second hole parts of said holes.

2. The semiconductor device of claim 1, further comprising a plurality of conductive balls, each of which is disposed on said electrical connection portion of a respective one of said conductive bodies.

3. The semiconductor device of claim 1, further comprising a protective layer formed on said pad-mounting surface to enclose connections formed among said extension portions of said conductive bodies and said bonding pads on said pad-mounting surface.

4. The semiconductor device of claim 3, wherein said protective layer is formed from an epoxy resin.

5. The semiconductor device of claim 1, wherein said conductive bodies are non-intersecting.

6. A semiconductor device adapted for mounting on a substrate, the substrate having a chip-mounting region provided with a plurality of solder points, said semiconductor device comprising:

a semiconductor chip having a pad-mounting surface provided with a plurality of bonding pads which are disposed on said pad-mounting surface at locations that are offset from locations of corresponding ones of the solder points on the chip-mounting region;

a photoresist layer formed on said pad-mounting surface of said semiconductor chip, said photoresist layer being formed with a plurality of contact receiving cavities at positions registered with said bonding pads on said pad-mounting surface, each of said contact receiving cavities including a first cavity part that exposes at least a part of the registered one of said bonding pads on said pad-mounting surface, and a second cavity part that exposes a respective portion of said pad-mounting surface and that extends from said first cavity part to a location corresponding to that of a respective one of the solder points on the chip-mounting region of the substrate; and a plurality of conductive bodies formed respectively in said contact receiving cavities, each of said conductive bodies having an extension portion that is disposed in said first cavity part so as to connect electrically with the registered one of said bonding pads and that serves as a circuit trace, and an electrical connection portion that is formed in said second cavity part on one end of said extension portion and that extends to the location corresponding to that of the respective one of the solder points on the chip-mounting region of the substrate.

7. The semiconductor device of claim 6, further comprising a plurality of conductive balls, each of which is disposed on said electrical connection portion of a respective one of said conductive bodies.

8. The semiconductor device of claim 6, further comprising a protective layer formed on said photoresist layer to cover connections formed among said extension portions of said conductive bodies and said bonding pads on said pad-mounting surface.

9. The semiconductor device of claim 8, wherein said protective layer is formed from an epoxy resin.

10. The semiconductor device of claim 6, wherein said conductive bodies are non-intersecting.

* * * * *